(12) United States Patent
Osuga (10) Patent No.: US 7,108,471 B2
(45) Date of Patent: Sep. 19, 2006

(54) TRANSPORTING TOOL FOR OBJECT TO BE TESTED, AND OBJECT-TO-BE-TESTED TRANSPORTING SYSTEM

(75) Inventor: Yasuhiro Osuga, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 27 days.

(21) Appl. No.: 10/793,188

(22) Filed: Mar. 5, 2004

(65) Prior Publication Data

US 2005/0005702 A1     Jan. 13, 2005

Related U.S. Application Data

(63) Continuation of application No. PCT/JP02/08474, filed on Aug. 22, 2002.

(30) Foreign Application Priority Data

Sep. 6, 2001  (JP)  .............................. 2001-271059

(51) Int. Cl.
  *B65H 5/00*  (2006.01)
(52) U.S. Cl. ................................ 414/222.01; 294/64.1; 901/40
(58) Field of Classification Search ........... 414/222.01, 414/222.05, 222.07, 744.1, 744.4, 744.5, 414/744.8, 935, 941; 269/21; 294/64.1; 901/40
See application file for complete search history.

(56) References Cited

U.S. PATENT DOCUMENTS

| | | | | |
|---|---|---|---|---|
| 5,046,909 A | * | 9/1991 | Murdoch | ..................... 294/113 |
| 5,636,964 A | * | 6/1997 | Somekh et al. | ............. 414/806 |
| 2001/0022652 A1 | | 9/2001 | van Schaik et al. | |

FOREIGN PATENT DOCUMENTS

| | | |
|---|---|---|
| JP | 3-102849 | 4/1991 |
| JP | 7-58175 | 3/1995 |
| JP | 7-147311 | 6/1995 |
| JP | 10-261676 | 9/1998 |
| JP | 2001-118871 | 4/2001 |
| WO | WO99/39999 | 12/1999 |

* cited by examiner

Primary Examiner—Donald Underwood
(74) Attorney, Agent, or Firm—Oblon, Spivak, McClelland, Maier & Neustadt, P.C.

(57) ABSTRACT

A transporting tool of this invention transports a cracked wafer between an unload table and a test position through fork, having a vacuum suction mechanism, and a main chuck. The transporting tool of this invention has a first groove formed in a first surface of the transporting tool, a first through hole which is formed to correspond to a first opening of the fork and is open to the first groove, a second groove formed in a second surface to correspond to an attracting groove of the main chuck, and a second through hole which allows the first groove and second groove to communicate with each other.

16 Claims, 6 Drawing Sheets

TRANSPORTING TOOL FOR OBJECT TO BE TESTED, AND OBJECT-TO-BE-TESTED TRANSPORTING SYSTEM

CROSS-REFERENCE TO RELATED APPLICATIONS

This is a Continuation Application of PCT Application No. PCT/JP02/08474, filed Aug. 22, 2002, which was not published under PCT Article 21(2) in English.

This application is based upon and claims the benefit of priority from prior Japanese Patent Application No. 2001-271059, filed Sep. 6, 2001, the entire contents of which are incorporated herein by reference.

BACKGROUND OF THE INVENTION

1. Field of the Invention

The present invention relates to a transporting tool suitably used in a probe apparatus or the like to transport an object to be tested (e.g., wafer), and a transporting system to transport the object to be tested. More specifically, the present invention relates to a transporting tool and a transporting system which can transport even a non-fixed-form object to be tested (e.g., a cracked wafer).

2. Description of the Related Art

The present invention can be applied to various types of apparatuses to process or test an object to be tested, e.g., a wafer itself, or a plurality of semiconductor elements or liquid crystal elements formed on the wafer.

In the following description, for the sake of more practical explanation, a probe apparatus which tests individual semiconductor elements formed on a wafer will be described hereinafter.

Figure 7A:
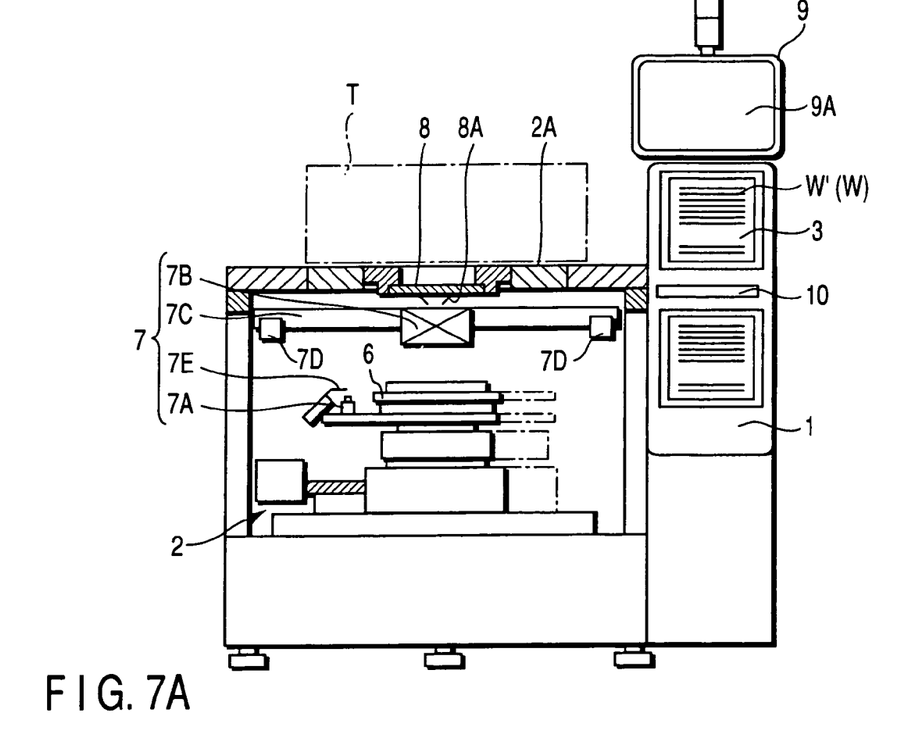
FIG. 7A is a partially cutaway front view of the same.
Figure 7B:
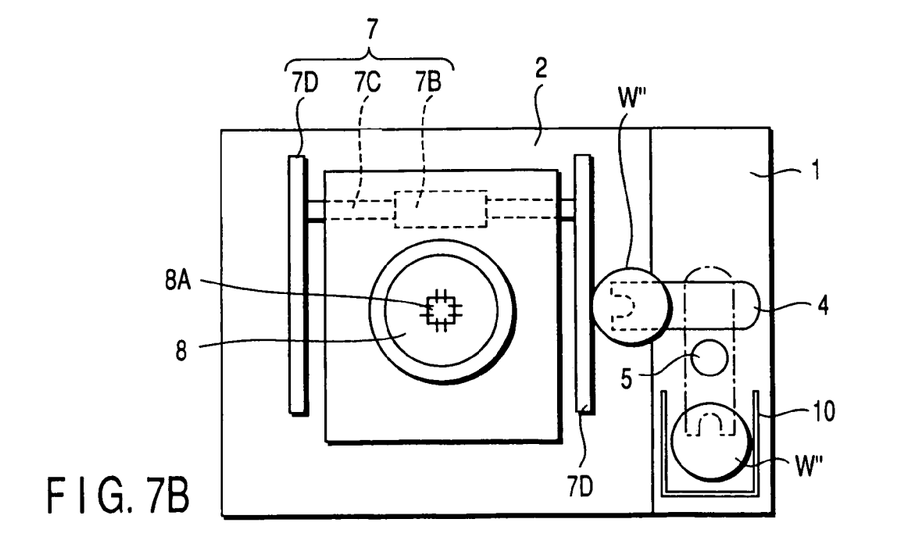
FIG. 7B is a plan view showing the internal arrangement of the same.

A probe apparatus which tests individual semiconductor elements formed on the wafer is widely known. FIGS. 7A and 7B show an example of the probe apparatus. The probe apparatus has a loader chamber 1 from which a fixed-form wafer W' is transported, and a prober chamber 2 where the electrical characteristics of the fixed-form wafer W' transferred from the loader chamber 1 are tested. A cassette storing portion 3 where a cassette C which stores the fixed-form wafer W' is placed, a transporting arm (to be referred to as fork hereinafter) 4 which transports the fixed-form wafer W' to the loader chamber 1, and a sub chuck 5 are disposed in the loader chamber 1. The sub chuck 5 prealigns the position of the wafer with reference to its orientation flat while transporting the fixed-form wafer W' with the fork 4. An object-to-be-tested stage table (to be referred to as a main chuck hereinafter) 6 where the prealigned fixed-form wafer W' received from the fork 4 is to be placed, an aligning mechanism (to be referred to as an alignment mechanism hereinafter) 7 to accurately align the fixed-form wafer W' on the main chuck 6, and a probe card 8 having a large number of probes 8A which come into electrical contact with the electrode pads of the fixed-form wafer W' aligned by the alignment mechanism 7 are disposed in the prober chamber 2. The main chuck 6 has a mechanism to move in the X, Y, Z, and θ directions. The probe card 8 is fixed to a head plate 2A arranged on the upper surface of the prober chamber 2.

As shown in FIGS. 7A and 7B, the alignment mechanism 7 has a lower CCD camera 7A, upper CCD camera 7B, and control device. The lower CCD camera 7A is provided to the main chuck 6, and photographs the images of the probes 8A of the probe card 8 from below. The upper CCD camera 7B is disposed at the center of an alignment bridge (7C), and photographs the image of the fixed-form wafer W' on the main chuck 6 from above. The photographed images of the probes 8A and fixed-form wafer W' are displayed on a monitor screen 9A of a display device 9. The alignment bridge 7C moves from the deepest portion (the upper portion in FIG. 7B) of the prober chamber 2 to the probe center along guide rails 7D disposed above the prober chamber 2 in the Y direction. A target 7E which can move forward to above the lower CCD camera 7A and backward from it is provided to the main chuck 6. The lower CCD camera 7A photographs the images of the needle points of the probes 8A and obtains the heights of the needle points. After that, the optical axis of the lower CCD camera 7A is set to coincide with the optical axis of the upper CCD camera 7B through the target 7E. The position of the main chuck 6 at this time is used as a reference position when aligning the fixed-form wafer W' and probes 8A.

A test head T is swingably disposed in the prober chamber 2. The test head T is electrically connected to the probe card 8 through an interface (not shown). A signal from a tester is transmitted to the electrode pads of the fixed-form wafer W' through the test head T and probes 8A. The electrical characteristics of a plurality of semiconductor elements (to be also described as chips hereinafter) formed on the fixed-form wafer W' are tested with this signal.

The loader chamber 1 has a wafer storing table (to be described as an unload table hereinafter) 10. The unload table 10 can be inserted in and extracted from the front surface of the loader chamber 1. The unload table 10 is used when, e.g., testing a monitor wafer W''.

As described above, when a fixed-form wafer having a predetermined diameter is to be tested, fixed-form wafers W' are automatically extracted one by one from the cassette C in the cassette stage portion 3, and the electrical characteristics of the fixed-form wafers W' are tested. In the manufacturing process of, e.g., semiconductor elements, a wafer may be cracked. As the cracked wafer has a diameter smaller than that of the fixed-form wafer, it cannot be stored in the cassette C or automatically extracted from the cassette C. Wafers to be tested are limited to, e.g., fixed-form wafers W' having circular shapes or the like. Cracked wafers other than the fixed-form wafers W' or other non-fixed-form wafers cannot be tested. For this reason, when testing a cracked wafer, the operator must open the prober chamber 2 and place the cracked wafer on the main chuck 6 manually. Software for driving a conventional probe apparatus does not cope with manual operation done by an operator. Thus, sufficient safety is not always ensured when the operator recovers a non-fixed-form wafer from the main chuck 6 manually.

BRIEF SUMMARY OF THE INVENTION

The present invention solves at least one of the problems described above. According to an embodiment of the present invention, a non-fixed-form object to be tested can be automatically transported between an object-to-be-tested storing table and a main chuck by only storing the non-fixed-form object to be tested in the object-to-be-tested storing table. According to the embodiment of the present invention, a very safe transporting tool and transporting system to transport an object to be tested, can be provided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

According to the first aspect of the present invention, there is provided a transporting tool (11) for transporting an object to be tested (W, W') to and from an object-to-be-tested stage table (6) by a transporting arm (4). In the transporting tool, the object to be tested has either one of a non-fixed form (W) and fixed form (W'), the transporting arm comprises a first opening (4A) for evacuation on a surface (4B) where the object to be tested is to be placed, and the object-to-be-tested stage table has a third groove (6A), on a surface (6B) where the object to be tested is to be placed, to draw the object to be tested by vacuum suction.

The transporting tool comprises:

a main body (11A) having a first surface (11B) to place the object to be tested thereon;

a first groove (111) formed in the first surface (11B) of the main body to draw the object to be tested by vacuum suction;

a second opening (112A) formed in a second surface (11C) of the main body which is opposite to the first surface, the second opening being aligned with the first opening (4A) of the transporting arm;

a first through hole (112) formed between the first surface and the second surface, which is opposite to the first surface, of the main body, one end of the first through hole being open to the first groove and the other end thereof being open to the second opening;

a second groove (113) formed in the second surface of the main body, the second groove being evacuated through the third groove of the object-to-be-tested stage table with the transporting tool being placed on the object-to-be-tested stage table; and at least one second through hole (114) which connects the second and first grooves of the main body.

According to the second aspect of the present invention, there is provided an object-to-be-tested transporting system (30) for transporting an object to be tested (W, W') to and from an object-to-be-tested stage table (6). The object to be tested has either one of a non-fixed form (W) and fixed form (W'), and the object-to-be-tested stage table has a third groove (6A), on a surface (6B) where the object to be tested is to be placed, to draw the object to be tested by vacuum suction. The object-to-be-tested system comprises:

(A) a transporting tool (11) to place thereon and transport the object to be tested, the transporting tool comprising:

(A1) a main body (11A) having a first surface (11B) to place the object to be tested thereon;

(A2) a first groove (111) formed in the first surface (11B) of the main body to draw the object to be tested by vacuum suction;

(A3) a second opening (112A) formed in a second surface (11C) of the main body which is opposite to the first surface, the second opening being aligned with a first opening (4A) of the transporting arm;

(A4) a first through hole (112) formed between the first surface and the second surface, which is opposite to the first surface, of the main body, one end of the first through hole being open to the first groove and the other end thereof being open to the second opening;

(A5) a second groove (113) formed in the second surface of the main body, the second groove being evacuated through the third groove of the main chick with the transporting tool being placed on the main chuck; and (A6) at least one second through hole (114) which connects the second and first grooves of the main body, (B) an object-to-be-tested storing table (10) which can move forward and backward, the object-to-be-tested storing table serving to store at least one of the object to be tested and transporting tool; and (C) a transporting arm (4) which draws by suction, holds, and transports the transporting tool (11) where the object to be tested is placed, the transporting arm comprising a first opening (4A) for evacuation on a surface (4B) where the object to be tested is to be placed.

The transporting tool and transporting system described above preferably comprise at least one of the following items:

The object to be tested is a wafer, and the first groove is a groove formed at a center of the first surface of the main body.

The main body of the transporting tool is made of a ceramic material.

The first surface of the transporting tool is covered with a conductive metal.

The second opening 112A has at least two openings to correspond to each first through hole.

The first groove (111) of the main body has a plurality of annular grooves (111A) formed concentrically, and at least one first connection groove (111B) to connect the annular grooves to each other.

The second through hole (114) includes a plurality of through holes arranged to open to the annular grooves (111A), and the first groove (111) has a second connection groove (111C) which connects the plurality of second through holes to each other.

The first surface (11B) of the main body of the transporting tool has first positioning means (115) for positioning the non-fixed-form object to be tested.

BRIEF DESCRIPTION OF THE SEVERAL VIEWS OF THE DRAWING

FIGS. 2A and 2B are views showing the wafer transporting tool shown in FIG. 1, in which

FIGS. 3A and 3B are views showing the relationship between the annular groove and first through holes of the wafer transporting tool shown in FIGS. 2A and 2B, in which

FIGS. 4A and 4B are views showing an unload table in the wafer transporting system of the present invention, in which

FIGS. 6A and 6B are views showing an example of a probe apparatus that employs the transporting system of the present invention, in which FIGS. 7A and 7B are views showing an example of a conventional probe apparatus, in which

DETAILED DESCRIPTION OF THE INVENTION

The present invention can be applied to various types of apparatus to process or test an object to be tested, e.g., a wafer itself, or a plurality of semiconductor elements or liquid crystal elements on the wafer.

In the following description, for the sake of more practical explanation, a probe apparatus which tests individual semiconductor elements formed on a wafer will be described. Note that the present invention is not limited to this probe apparatus.

The present invention will be described with reference to an embodiment shown in FIGS. 1 to 6B. A transporting tool to transport a wafer and a transporting system which transports the wafer, according to this embodiment, can be suitably used in the probe apparatus. This probe apparatus can be basically formed in the same manner as the probe apparatus shown in FIGS. 7A and 7B. Hence, in the following description, the transporting tool and transporting system according to this embodiment will be described with reference to FIGS. 7A and 7B as well.

Figures 1, 3A:
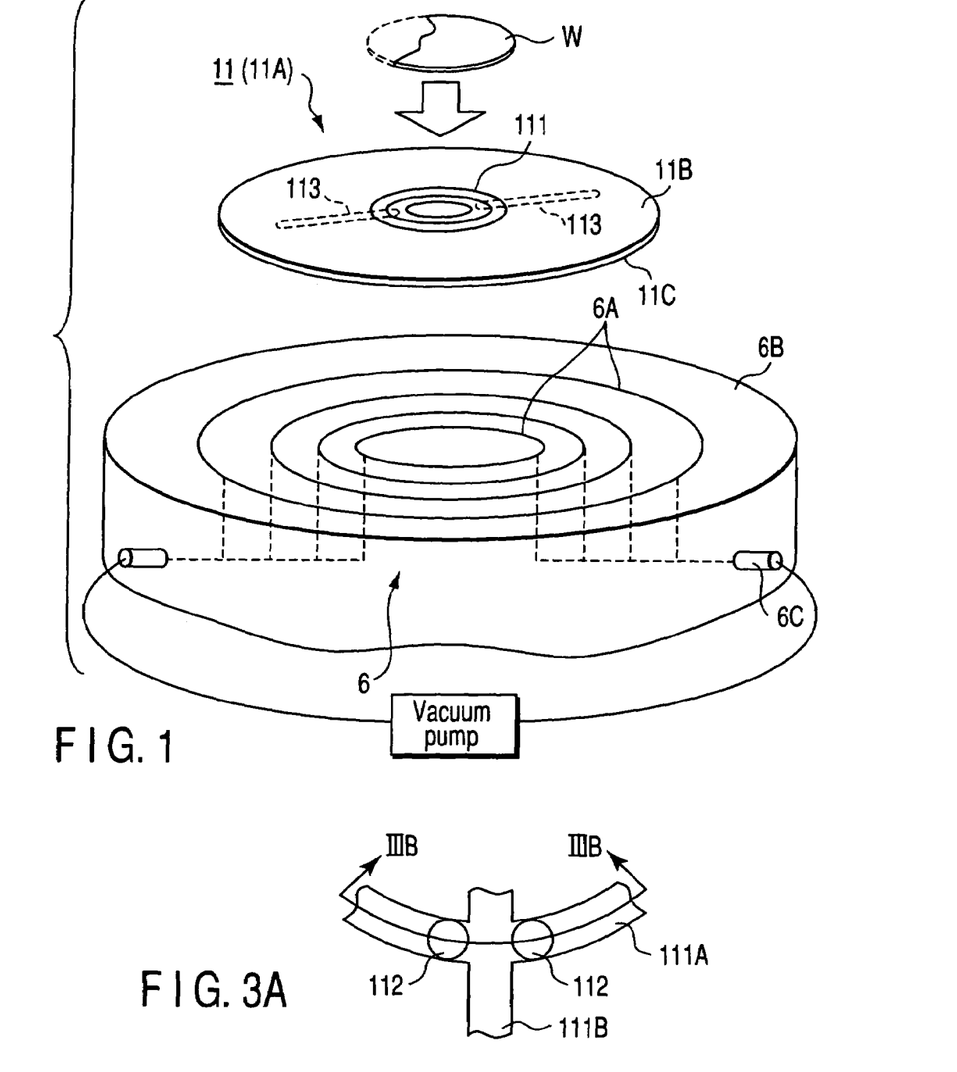
FIG. 1 is a perspective view showing the concept of a wafer transporting system according to an embodiment of the present invention.
FIG. 3A is a plan view showing the main part of the same.

As shown in FIG. 1, a main body 11A of a transporting tool 11 according to this embodiment can be formed of, e.g., a ceramic flat plate. The transporting tool 11, with a non-fixed-form wafer (e.g., in FIG. 1, a cracked wafer from which a portion indicated by a cracked line is missing) W being placed on it, is transported between an object-to-be-tested stage table (to be referred to as a main chuck hereinafter) 6 and unload table 10 through a transporting arm (to be referred to as fork hereinafter) 4. More specifically, the transporting tool (to be referred to as the wafer transporting tool hereinafter) 11, with the non-fixed-form wafer (to be also referred to as the cracked wafer hereinafter) W being placed on it, is placed on the unload table 10. The fork 4 move the transporting tool carrying the cracked wafer W from the unload table 10 onto the main chuck 6. The main chuck 6 moves in the X, Y, and Z directions, so that the cracked wafer W on the transporting tool 11 can be tested. After the test is ended, the fork 4 transport the transporting tool 11 together with the cracked wafer W from the main chuck 6 to the unload table 10. When the fork 4 transport the transporting tool 11 with the cracked wafer W being placed on it, the fork 4 and main chuck 6 are connected to a vacuum pump through pipes 4C and 6C, respectively.

The fork 4 have at least one first opening 4A in their upper surface. The first opening 4A can be connected to an exhaust device (vacuum pump) through an exhaust channel (4C). The upper surface of the main chuck 6 can have a plurality of annular third grooves 6A to draw the wafer W or transporting tool 11 by vacuum suction. The third grooves 6A are connected to the exhaust device (vacuum pump) through an exhaust channel (6C). Thus, when the transporting tool 11 is placed on the fork 4 or main chuck 6, it is drawn onto the fork 4 or main chuck 6 by vacuum suction with a vacuum force from the first opening 4A or third grooves 6A through the exhaust device.

When the transporting tool 11 is to be drawn onto the fork 4 or main chuck 6 by vacuum suction, the suction grooves and through holes formed in the wafer transporting tool 11 can also be utilized. The suction grooves and through holes of the wafer transporting tool 11 will be described with reference to FIGS. 1 to 3B. The transporting tool 11 can be formed of a ceramic member having a shape larger than that of a fixed-form wafer (e.g., a complete wafer) W'.

Figure 2A:
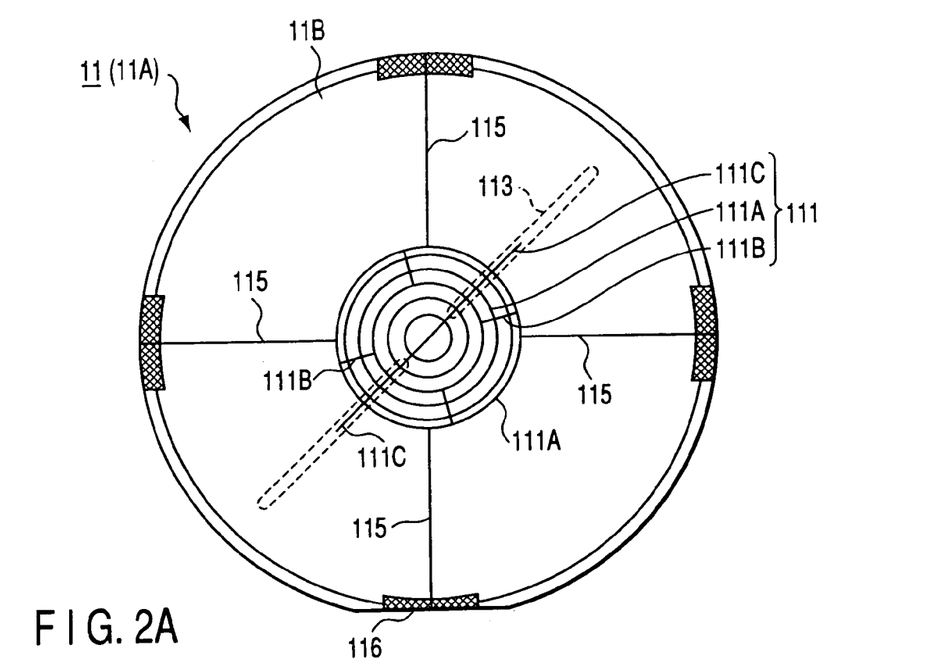
FIG. 2A is a plan view showing the upper surface of the same.
Figure 2B:
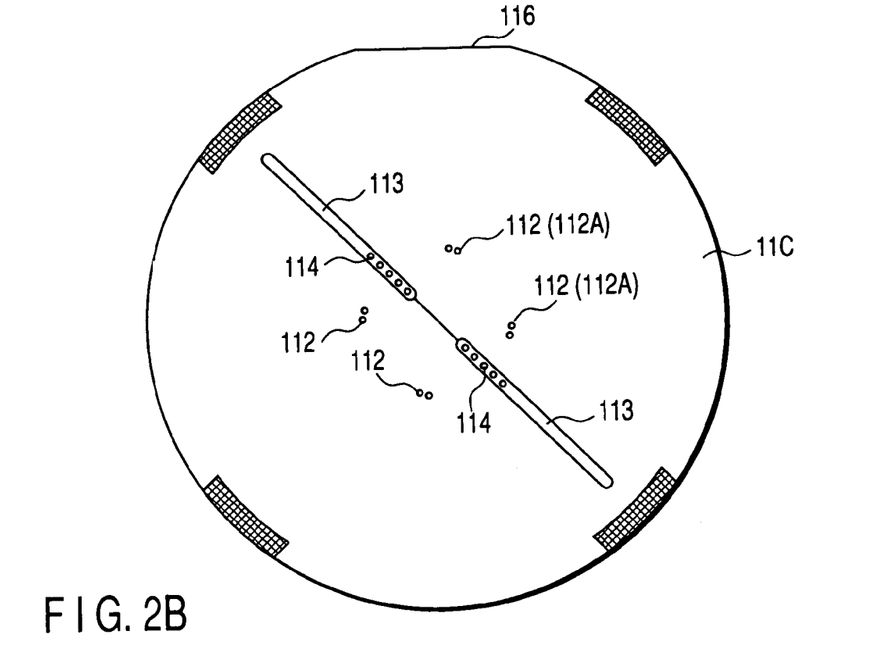
FIG. 2B is a plan view showing the lower surface of the same.

As shown in FIGS. 1, 2A, and 2B, the transporting tool 11 has a first groove 111 formed at substantially the center of its first surface 11B, first through holes 112, and second grooves 113 and second through holes 114 formed in its second surface 11C. One end of each first through hole 112 is connected to a second opening 112A, and the other end thereof is open to the first groove 111. The second through holes 114 allow the first and second grooves 111 and 113 to communicate with each other.

More specifically, the first groove 111 has a plurality of (six in this embodiment) annular grooves 111A formed concentrically (e.g., with concentric shapes), and first connection grooves 111B which connect the annular grooves 111A to each other. The first connection grooves 111B shown in FIG. 2A connect the four outer annular grooves. The annular grooves 111A can be formed in such a region that can reliably draw even a non-fixed-form wafer W having a comparatively small area due to its missing portion. The minimum size of the cracked wafer W can be determined in advance. The size of the cracked wafer W should be sufficient for covering the annular grooves 111A. As shown in FIG. 2A, the first connection grooves 111B can extend in the radial direction, and can be formed equidistantly from each other in the circumferential direction.

As shown in FIG. 2B, for example, the first through holes 112 can include eight holes consisting of pairs. Since the through holes 112 consist of pairs, evacuation from the through holes 112 can be performed smoothly.

Figure 3B:
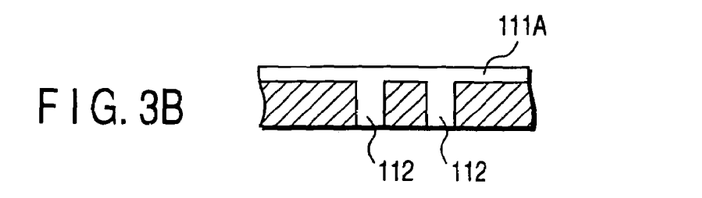
FIG. 3B is a sectional view taken along the line IIIB—IIIB of FIG. 3A.
Figure 5:
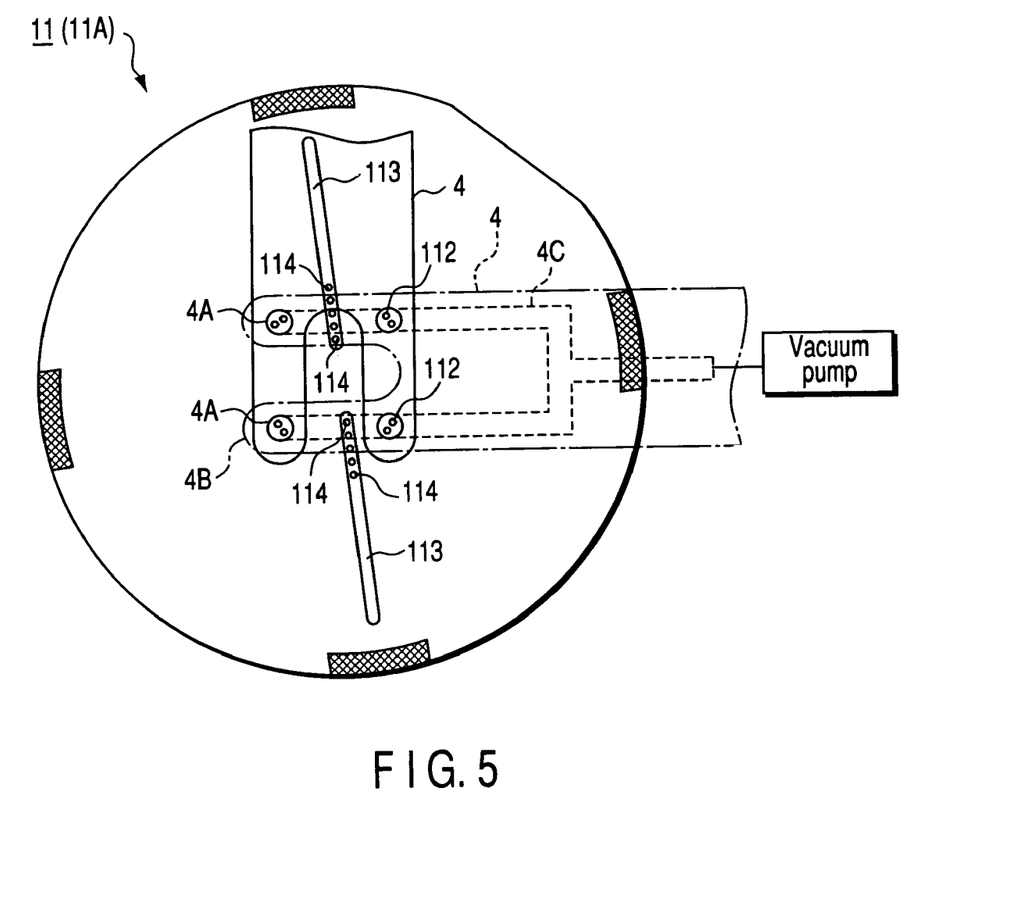
FIG. 5 is a plan view showing the relationship between a transporting arm and the first through holes of the wafer transporting tool shown in FIGS. 2A and 2B.

The four pairs of through holes 112 can be so arranged as to interpose four intersections, i.e., the third annular groove 111 counted from the outer side and the first connection grooves 111B. FIGS. 3A and 3B show the relationship among the annular grooves 111A, first connection grooves 111B, and first through holes 112 in enlargement. The positions of the first through holes 112 correspond to the openings 4A of the fork 4. For example, as shown in FIG. 5, when the fork 4 are inserted in the unload table 10, the first through holes 112 are located in the first openings 4A of the fork 4, so that the interior of the first groove 111 is evacuated through the first through holes 112. As shown in FIGS. 2A and 2B, the first groove 111 can have second connection grooves 111C which connect the five outer annular grooves 111A to each other. As shown in FIG. 2A, the two second connection grooves 111C can extend in the radial direction at positions where they do not overlap the first connection grooves 111B. The second connection grooves 111 can be so formed as to be located on one straight line.

As shown in FIGS. 2A and 2B, the second grooves 113 can be formed in the other sides of the second connection grooves 111C. As shown in FIG. 1, the second grooves 113 can be formed such that, when the transporting tool 11 is placed on the main chuck 6, they may intersect the plurality of annular third grooves 6A formed in the upper surface of the main chuck 6. The second through holes 114 can be formed at the intersections of the second connection grooves 111C and five outer annular grooves 11A. When the upper surface of the main chuck 6 draws the wafer transporting tool 11 by vacuum suction, the first groove 111 can be evacuated through the second grooves 113 and second through holes 114.

As shown in FIG. 2A, four alignment lines 115 which determine the direction of the cracked wafer W can be formed on the first surface 11B of the wafer transporting tool 11. The four alignment lines 115 extend from a position slightly outside the annular grooves 111A to the outer circumference of the wafer transporting tool 11 radially, and intersect each other at the center of the annular grooves 11A. One of the four alignment lines 115 perpendicularly intersects the center of an orientation flat 116. Accordingly, the non-fixed-form wafer W is placed on the wafer transporting tool 11 such that its orientation flat 0 perpendicularly intersects the alignment line 115. When the non-fixed-form wafer W lacks its orientation flat 0, it is placed on the wafer transporting tool 11 such that the direction of the scrub line of the cracked wafer W is aligned with the direction of the corresponding alignment line 115.

The transporting tool 11 can be made of a ceramic material into a wafer shape, as described above. The entire surface of the transporting tool can be covered with a material having good conductivity, e.g., gold or a gold alloy. This covering process can be performed by, e.g., a metal deposition process. The ceramic-made transporting tool 11 can cope with high-temperature testing of the non-fixed-form wafer W. When the entire surface of the wafer transporting tool 11 is covered with a conductive material, the non-fixed-form wafer W during testing can be set at ground potential.

Figures 4A, 4B:
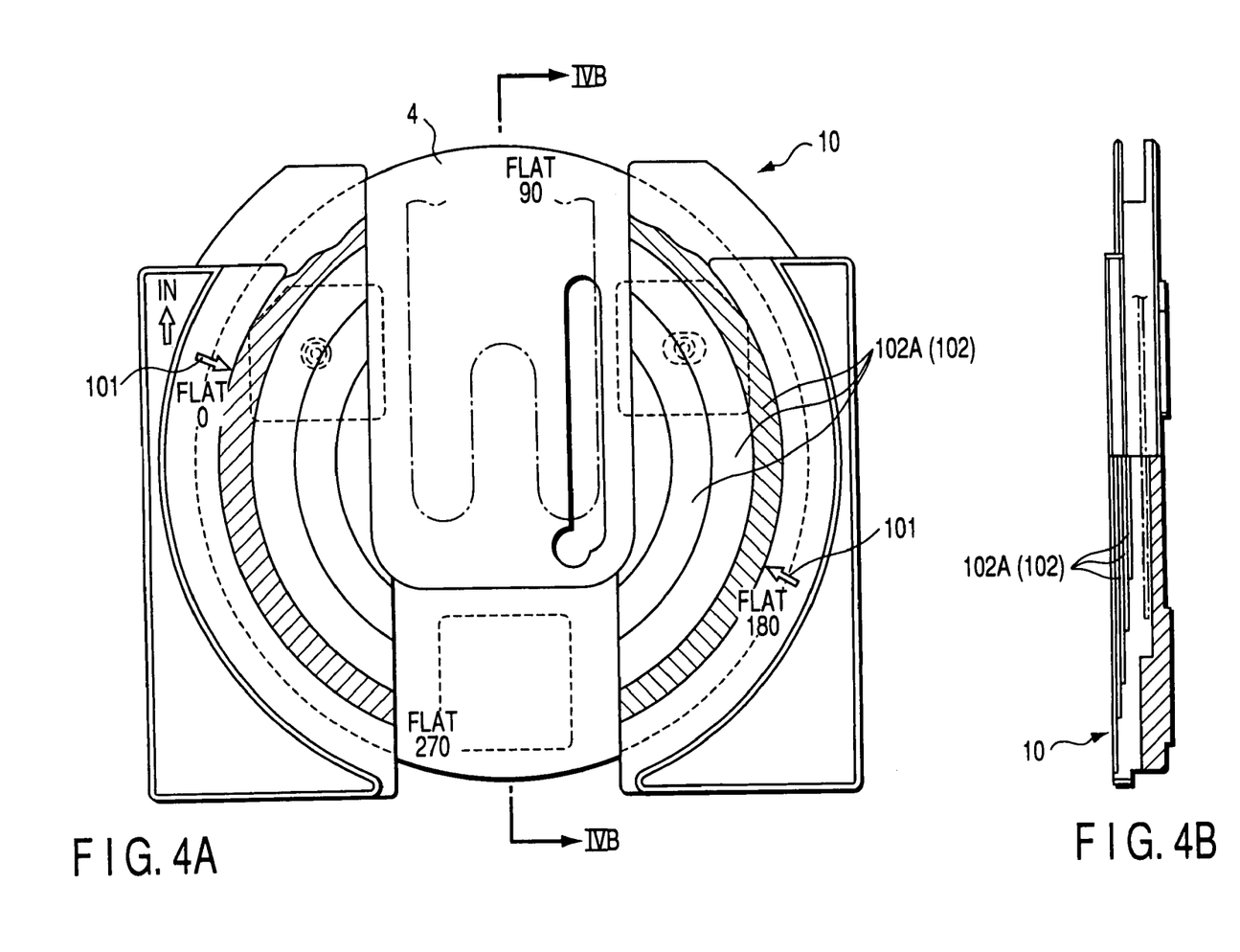
FIG. 4A is a plan view showing the upper surface of the same.
FIG. 4B is a sectional view taken along the line IVB—IVB of FIG. 4A.

The unload table 10 can have a substantially rectangular shape, as shown in FIG. 4A. Positioning arrows 101 corresponding to the alignment lines 115 of the wafer transporting tool 11 can be arranged on the surface of the unload table 10. The arrows as the alignment means can be arranged at two positions spaced apart from each other by 180° in the circumferential direction. Accordingly, even when a sub chuck 5 (see FIGS. 7A and 7B) is not used, if the alignment lines 115 of the transporting tool 11 are aligned with the arrows 101, the direction of the transporting tool 11 and accordingly the direction of the non-fixed-form wafer W can be aligned by only placing the transporting tool 11 on the unload table 10. At this time, the orientation flat 116 of the transporting tool 11 coincides with the position of "FLAT" engraved on the unload table 10.

As shown in FIG. 4A, a circular disk-like wafer stage portion 102 is formed at the center of the unload table 10. As shown in FIG. 4B, the wafer stage portion 102 can have a plurality of wafer supports 102A which form steps and have different diameters. When a transporting tool 11 or a fixed-form wafer having a different outer diameter is placed on the wafer stage portion 102, the respective wafer supports 102A support the peripheral portions of the wafer transporting tool 11 and of the fixed-form wafer. An arm entering portion 102B is formed at the center of the wafer stage portion 102 in the back-and-forth direction, as indicated by an alternate long and short dashed line in FIGS. 4A and 4B. As shown in FIGS. 4A and 4B, the fork 4 enter and retreat from the arm entering portion 102B. The bottom surface of the arm entering portion 102B is lower than the lowest wafer support 102A. In FIG. 4A, the wafer transporting tool 11 is supported by the wafer support 102A indicated by hatched lines.

Figure 6A:
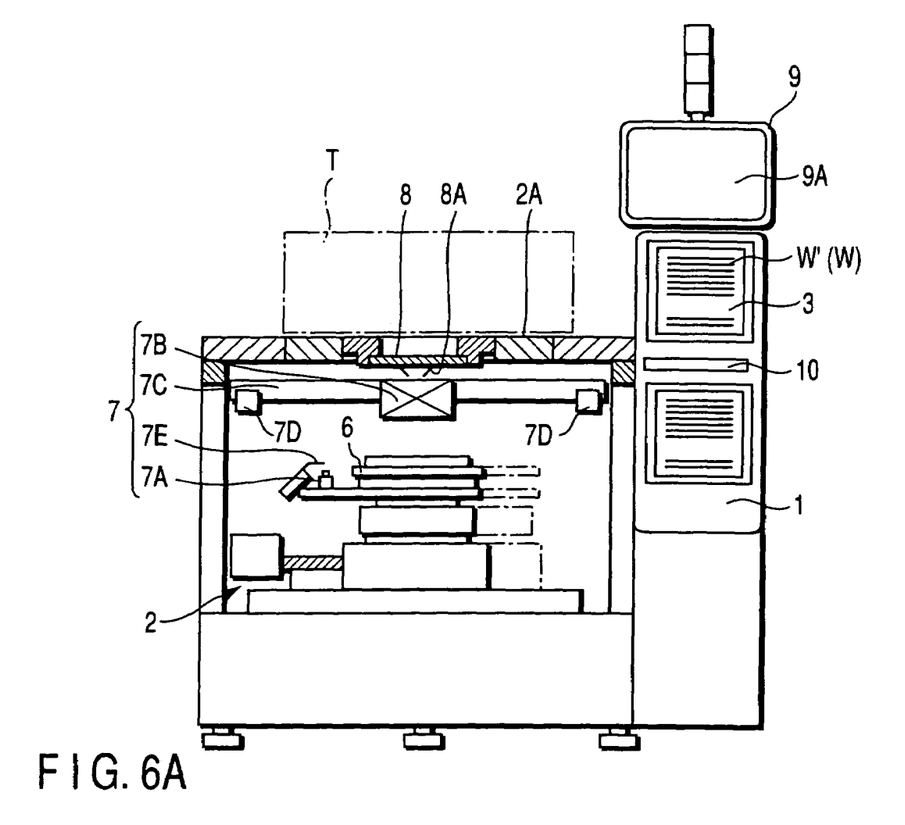
FIG. 6A is a partially cutaway front view of the same.

As shown in FIG. 6A, the wafer transporting system of this embodiment can have the unload table 10 which can move forward and backward in a loader chamber 1, the fork 4 which transport the transporting tool 11 and non-fixed-form wafer W placed inside the unload table 10, and the main chuck 606 which places thereon the transporting tool 11 and cracked wafer W transported from the fork 4. The main chuck 6 draws and holds the transporting tool 11 and cracked wafer W simultaneously by vacuum suction.

A case will be described wherein the cracked wafer W is to be transported by using the wafer transporting system described above. First, the unload table 10 is pulled out from the front surface of the loader chamber 1. The wafer transporting tool 11 is placed on the wafer supports 102A of the wafer stage portion 102 of the unload table 10. At this time, the alignment lines 115 of the wafer transporting tool 11 are aligned with the arrows 101 of the wafer stage portion 102. The cracked wafer W is placed on the wafer transporting tool 11. At this time, the orientation flat 0 of the cracked wafer W is set to perpendicularly intersect the corresponding alignment line 115 of the wafer transporting tool 11. The scrub line of the cracked wafer W is aligned with the direction of the corresponding alignment line 115. Thus, the cracked wafer W and wafer transporting tool 11 are prealigned. After this, the unload table 10 is stored in the loader chamber.

Figure 6B:
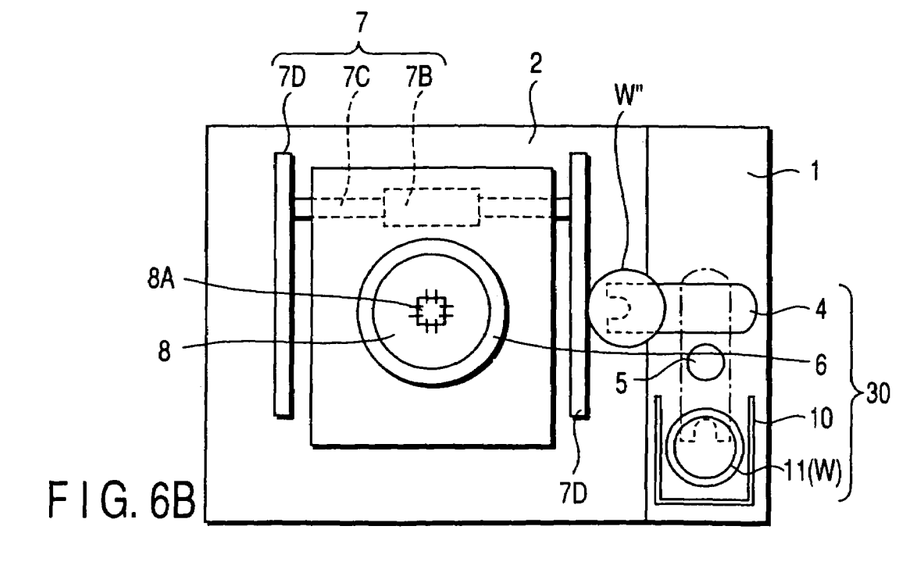
FIG. 6B is a plan view showing the internal arrangement of the same.

Subsequently, the probe apparatus is driven through a control device. The fork 4 enter the arm entering portion 102B of the unload table 10, and move upward slightly, as shown in FIGS. 4A and 4B. The wafer transporting tool 11 is placed on the fork 4. In this state, the openings 4A of the fork 4 coincide with the first through holes 112 of the wafer transporting tool 11, as shown in, e.g., FIG. 5. The alignment lines 115 are arranged with a shift of 90° from each other in the circumferential direction. Hence, even when the alignment lines 115 are prealigned with a shift of 90° (or 180°, or 270°), the openings 4A of the fork 4 and the first through holes 112 coincide, as indicated by an alternate long and short dashed line in FIG. 5. Successively, the exhaust device is driven under the control of the control device. The interior of the first groove 111 is evacuated through the openings 4A of the fork 4 and the first through holes 112, so that the cracked wafer W and wafer transporting tool 11 are drawn by suction and fixed on the fork 4. After the cracked wafer W is drawn by vacuum suction onto the fork 4, the fork 4 move backward from the unload table 10. As shown in FIG. 6B, the fork 4 change their direction by 90°, and enter the prober chamber 2. At this time, the main chuck 6 in the prober chamber 2 is preferably ready to receive the cracked wafer W.

After the fork 4 move forward onto the main chuck 6, elevating pins (not shown) of the main chuck 6 move upward, and simultaneously evacuation of the fork 4 is stopped. After the elevating pins lift the wafer transporting tool 11 off the fork 4, the fork 4 move backward from the prober chamber 2. As the elevating pins retract into the main chuck 6, the wafer transporting tool 11 is placed on the main chuck 6. The second grooves 113 of the transporting tool 11 intersect the third grooves 6A of the main chuck 6. The control device actuates the exhaust device of the main chuck 6, thus evacuating the third grooves 6A. The interior of the first groove 111 is pressure-reduced through the second through holes 114 of the transporting tool 11, and the cracked wafer W and wafer transporting tool 11 are drawn by suction and fixed on the main chuck 6.

After that, the main chuck 6 moves to the probe center, and an alignment mechanism 7 is actuated. An alignment bridge 7C moves forward to the probe center. An upper CCD camera 7B photographs the image of the cracked wafer W, automatically recognizes the state of arrays of the semiconductor elements in the cracked wafer W, and grasps the test target of the semiconductor elements. The main chuck 6 moves in the X and Y directions to cause the electrodes of the respective semiconductor elements inside the cracked wafer W to come into contact with the corresponding electrodes of the probe card, so that the electrical characteristics of the semiconductor elements are tested sequentially.

When the test for the cracked wafer W is ended, the main chuck 6 moves to a transfer position for the cracked wafer W. The exhaust device of the main chuck 6 stops, and the elevating pins move upward to lift the wafer transporting tool 11 off the main chuck 6. The fork 4 move forward to a space between the main chuck 6 and the lifted wafer transporting tool 11. The exhaust device of the fork 4 is driven, and the elevating pins move downward. The fork 4 receive the cracked wafer W together with the wafer transporting tool 11, and move along a path opposite to the path for test start, to return the cracked wafer W together with the wafer transporting tool 11 to the unload table 10. Thus, the series of tests is ended.

As has been described above, according to this embodiment, the transporting tool 11 is placed on the unload table 10, and the cracked wafer W is placed on the transporting tool 11. Then, the transporting tool 11 together with the cracked wafer W inside the unload table 10 can be automatically transported to the main chuck through the fork 4 and main chuck 6.

According to this embodiment, after the cracked wafer W is tested, the fork 4 can return the wafer transporting tool 11 and cracked wafer W from the main chuck 6 to the unload table 10 automatically.

According to this embodiment, unlike in the conventional case, the cracked wafer W need not be placed on the main chuck 6 manually by opening the prober chamber 2. The cracked wafer W need not be recovered from the main chuck 6 manually, so that safety in the test can be ensured.

According to this embodiment, the first groove 111 can have the six concentric annular grooves 111A and the first connection grooves 111B which connect the annular grooves 111A. Hence, when transporting the wafer transporting arm 11 and cracked wafer W through the fork 4, all the annular grooves 111A and first connection grooves 111B can be evacuated reliably by only evacuating them through the fork 4 and first through holes 112, so that the wafer transporting tool 11 and cracked wafer W can be drawn by suction and fixed on the fork 4 reliably.

According to this embodiment, the first groove 111 has the second connection grooves 111C which connect the second through holes 114 to each other. When transporting the wafer transporting arm 11 and cracked wafer W through the main chuck 6, all the annular grooves 111A and first and second connection grooves 111B can be evacuated reliably by only evacuating the second through holes 114 through the main chuck 6, so that both the wafer transporting tool 11 and the cracked wafer W can be drawn by suction and fixed on the main chuck 6 reliably.

According to this embodiment, the alignment lines 115 which determine the direction of the cracked wafer W are formed on the surface of the transporting tool 11, and the arrows 101 corresponding to the alignment lines 115 are formed on the surface of the unload table 10. When placing the wafer transporting tool 11 and cracked wafer W on the unload table 10, they can be prealigned.

According to this embodiment, even a non-fixed-form wafer such as a cracked wafer can be automatically transported between the wafer storing table and main chuck (test stage) by only storing it in the wafer storing table.

According to this embodiment, a transporting tool to transport a wafer, and transporting system, which can test a non-fixed-form wafer reliably and safely, can be provided.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A transporting tool for transporting an object to be tested to and from an object-to-be-tested stage table by a transporting arm, the object to be tested having either one of a non-fixed form and fixed form, the transporting arm comprising at least one first opening for evacuation on a surface where the object to be tested is to be placed, and the object-to-be-tested stage table having at least one third groove, on a surface where the object to be tested is to be placed, to draw the object to be tested by vacuum suction, wherein the transporting tool comprises:

a main body having a first surface to place the object to be tested thereon;

at least one first groove formed in the first surface of the main body to draw the object to be tested by vacuum suction;

at least one second opening formed in a second surface of the main body which is opposite to the first surface, the second opening being alignable with the first opening of the transporting arm;

at least one first through hole formed between the first surface and the second surface, which is opposite to the first surface, of the main body, one end of the first through hole being open to the first groove and the other end thereof being open to the second opening;

at least one second groove formed in the second surface of the main body, the second groove being evacuateable through the third groove of the object-to-be-tested stage table with the transporting tool being placed on the object-to-be-tested stage table; and at least one second through hole which connects the second and first grooves of the main body, wherein the first opening of the transporting arm can draw, by vacuum suction, the object to be tested being placed on the transporting tool through the second opening, the first through hole, and the first groove of the transporting tool, and the third groove of the object-to-be-tested stage table can draw the object to be tested by vacuum suction through the second grove, the second through hole, and the first groove of the transporting tool.

2. A transporting tool according to claim 1, wherein the object to be tested is a wafer, and the at least one first groove is formed at a center of the first surface of the main body.

3. A transporting tool according to claim 2, wherein the main body of the transporting tool is made of a ceramic material.

4. A transporting tool according to claim 3, wherein the first surface of the transporting tool is covered with a conductive metal.

5. A transporting tool according to claim 2, wherein the at least one second opening has at least two openings to correspond to each first through hole.

6. A transporting tool according to claim 2, wherein the at least one first groove of the main body has a plurality of annular grooves formed concentrically, and at least one first connection groove to connect the annular grooves to each other.

7. A transporting tool according to claim 6, wherein the at least one second through hole includes a plurality of through holes arranged to open to the annular grooves, and the first groove has a at least one second connection groove which connects the plurality of second through holes to each other.

8. A transporting tool according to claim 2, wherein the first surface of the main body of the transporting tool has first positioning means for positioning the non-fixed-form object to be tested.

9. An object-to-be-tested transporting system for transporting an object to be tested to and from an object-to-be-tested stage table, the object to be tested having either one of a non-fixed form and fixed form, and the object-to-be-tested stage table having at least one third groove, on a surface where the object to be tested is to be placed, to draw the object to be tested by vacuum suction, wherein the object-to-be-tested system comprises:
- (A) a transporting tool to place thereon and transport the object to be tested, the transporting tool comprising:
- (A1) a main body having a first surface to place the object to be tested thereon;
- (A2) at least one first groove formed in the first surface of the main body to draw the object to be tested by vacuum suction;
- (A3) at least one second opening formed in a second surface of the main body which is opposite to the first surface, the second opening being aligned with at least one first opening of the transporting arm;
- (A4) at least one first through hole formed between the first surface and the second surface, which is opposite to the first surface, of the main body, one end of the first through hole being open to the first groove and the other end thereof being open to the second opening;
- (A5) at least one second groove formed in the second surface of the main body, the second groove being evacuated through the third groove of the main chick with the transporting tool being placed on the main chuck; and
- (A6) at least one second through hole which connects the second and first grooves of the main body,
- (B) an object-to-be-tested storing table which can move forward and backward, the object-to-be-tested storing table serving to store at least one of the object to be tested and transporting tool; and
- (C) a transporting arm which draws by suction, holds, and transports the transporting tool where the object to be tested is placed, the transporting arm comprising a first opening for evacuation on a surface where the object to be tested is to be placed, wherein the first opening of the transporting arm draws, by vacuum suction, the object to be tested being placed on the transporting tool through the second opening, the first through hole, and the first groove of the transporting tool, and the third groove of the object-to-be-tested stage table draws the object to be tested by vacuum suction through the second grove, the second through hole, and the first groove of the transporting tool.

10. An object-to-be-tested transporting system according to claim 9, wherein the object to be tested is a wafer, and the at least one first groove is formed at a center of the first surface of the main body.

11. An object-to-be-tested transporting system according to claim 10, wherein the main body of the transporting tool is made of a ceramic material.

12. An object-to-be-tested transporting system according to claim 11, wherein the first surface of the transporting tool is covered with a conductive metal.

13. An object-to-be-tested transporting system according to claim 10, wherein the at least one first groove of the main body has a plurality of annular grooves formed concentrically, and at least one first connection groove to connect the annular grooves to each other.

14. An object-to-be-tested transporting system according to claim 13, wherein the at least one second through hole includes a plurality of through holes arranged to correspond to the annular grooves, and the at least one first groove has a second connection groove which connects the plurality of second through holes to each other.

15. An object-to-be-tested transporting system according to claim 10, wherein the first surface of the main body of the transporting tool has first positioning means for positioning the non-fixed-form object to be tested.

16. An object-to-be-tested transporting system according to claim 10, wherein the surface of the object-to-be-tested stage table where the transporting tool is to be placed has second positioning means for positioning the transporting tool.

* * * * *